United States Patent
Odaka

(10) Patent No.: US 9,899,428 B2
(45) Date of Patent: Feb. 20, 2018

(54) DISPLAY DEVICE HAVING TERMINAL ELECTRODE INCLUDING STEPPED SURFACE

(71) Applicant: Japan Display Inc., Tokyo (JP)

(72) Inventor: Kazuhiro Odaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/362,945

(22) Filed: Nov. 29, 2016

(65) Prior Publication Data

US 2017/0250199 A1    Aug. 31, 2017

(30) Foreign Application Priority Data

Feb. 26, 2016    (JP) ................................. 2016-035722

(51) Int. Cl.
*H01L 27/12*    (2006.01)

(52) U.S. Cl.
CPC ........ *H01L 27/124* (2013.01); *H01L 27/1222* (2013.01); *H01L 27/1248* (2013.01)

(58) Field of Classification Search
CPC .......................... H01L 27/1244; H01L 27/124
USPC ......................................................... 257/739
See application file for complete search history.

(56) References Cited

U.S. PATENT DOCUMENTS

| | | | | |
|---|---|---|---|---|
| 5,621,246 A * | 4/1997 | Motoyama | ........ | H01L 23/49811 257/736 |
| 6,365,968 B1 * | 4/2002 | Qian | ........ | H01S 5/22 257/739 |
| 6,670,708 B2 * | 12/2003 | Choo | ........ | H01L 27/14601 257/350 |
| 8,026,588 B2 * | 9/2011 | Lee | ........ | H01L 24/03 257/690 |
| 2007/0076393 A1 * | 4/2007 | Jeong | ........ | H05K 1/111 361/767 |
| 2012/0138935 A1 * | 6/2012 | Park | ........ | H01L 27/3279 257/59 |
| 2012/0139000 A1 * | 6/2012 | Lee | ........ | H01L 27/1255 257/99 |
| 2013/0146879 A1 * | 6/2013 | Yamanaka | ........ | H01L 27/11 257/59 |
| 2014/0063394 A1 * | 3/2014 | Jung | ........ | H01L 27/0296 349/42 |
| 2015/0028327 A1 * | 1/2015 | Kim | ........ | H01L 27/1255 257/43 |

(Continued)

FOREIGN PATENT DOCUMENTS

JP    2003-202583 A    7/2003

*Primary Examiner* — Victoria K Hall
(74) *Attorney, Agent, or Firm* — Typha IP LLC

(57) ABSTRACT

A display device in an embodiment according to the present invention includes a substrate, a pixel part including a circuit element over the substrate, and a terminal part including a terminal electrode and located over the substrate, the terminal electrode electrically connected with the circuit element. The terminal electrode located over an underlying structure layer having a surface formed from at least one inclined surface, the underlying structure layer arranged between the terminal electrode and the substrate and a flat surface, and the terminal electrode including a stepped surface along a surface formed from the inclined surface and the flat surface of the underlying structure layer in a surface of the terminal electrode.

16 Claims, 14 Drawing Sheets

(56) References Cited

U.S. PATENT DOCUMENTS

2015/0053969 A1\* 2/2015 Ito .................. H01L 27/1225
                                                                            257/43
2017/0358642 A1\* 12/2017 Jo .................... H01L 27/3276

\* cited by examiner

DISPLAY DEVICE HAVING TERMINAL ELECTRODE INCLUDING STEPPED SURFACE

CROSS REFERENCE TO RELATED APPLICATIONS

This application is based upon and claims the benefit of priority from the prior Japanese Patent Application No. 2016-035722, filed on Feb. 26, 2016, the entire contents of which are incorporated herein by reference.

FIELD

The present invention is related to a display device and one embodiment of the invention disclosed in the present specification is related to a structure of a terminal part arranged in a display device.

BACKGROUND

A display device which utilizes the electro-optical effects of a liquid crystal and the light emission phenomenon of an organic electroluminescence material is arranged with a terminal part at one end of a substrate which is input with a control signal (video signal, clock signal etc.) for display an image. For example, a display device arranged with a pixel circuit using a thin film transistor arranged above a glass substrate is arranged with a terminal part input with a video signal at an end part of the glass substrate. The terminal part is connected with a flexible wiring substrate (also called a FPC "flexible printed circuit" substrate herein) using an anisotropic conductive film.

Each terminal electrode in a terminal part requires the formation of a good contact (electrical connection) with a FPC substrate. For example, a structure is disclosed in Japanese Laid Open Patent Publication No. 2003-202583 in which irregularities are provided to the surface of a terminal electrode so that conductive particles included in an ACF are securely captured between the terminal electrode and an electrode of a FPC substrate.

An ACF combines fine conductive particles in a thermosetting resin. A terminal part and FPC of a display device are electrically and physically connected by thermo-compression sandwiching an ACF. When adhesion of the ACF is weak at this time, the FPC substrate peels away from the display device. That is, even when conductive particles are captured above a terminal electrode, when adhesion with a thermosetting resin is weak, the reliability of an electrical connection decreases.

SUMMARY

A display device in an embodiment according to the present invention includes a substrate, a pixel part including a circuit element over the substrate, and a terminal part including a terminal electrode and located over the substrate, the terminal electrode electrically connected with the circuit element. The terminal electrode located over an underlying structure layer having a surface formed from at least one inclined surface, the underlying structure layer arranged between the terminal electrode and the substrate and a flat surface, and the terminal electrode including a stepped surface along a surface formed from the inclined surface and the flat surface of the underlying structure layer in a surface of the terminal electrode.

A display device in an embodiment according to the present invention includes a substrate, a pixel part including a circuit element, and a terminal part including a terminal electrode and located over the substrate, the terminal electrode electrically connected with the circuit element above a substrate. The pixel part including a pixel electrode and a transistor having a first semiconductor layer, gate insulating layer and gate electrode electrically connected with the pixel electrode, the terminal electrode located over an underlying structure layer having a surface formed from at least one inclined surface, the underlying structure layer arranged between the terminal electrode and the substrate and a flat surface, and the terminal electrode including a stepped surface along a surface formed from the inclined surface and the flat surface of the underlying structure layer in a surface of the terminal electrode.

DESCRIPTION OF EMBODIMENTS

Figure 1:
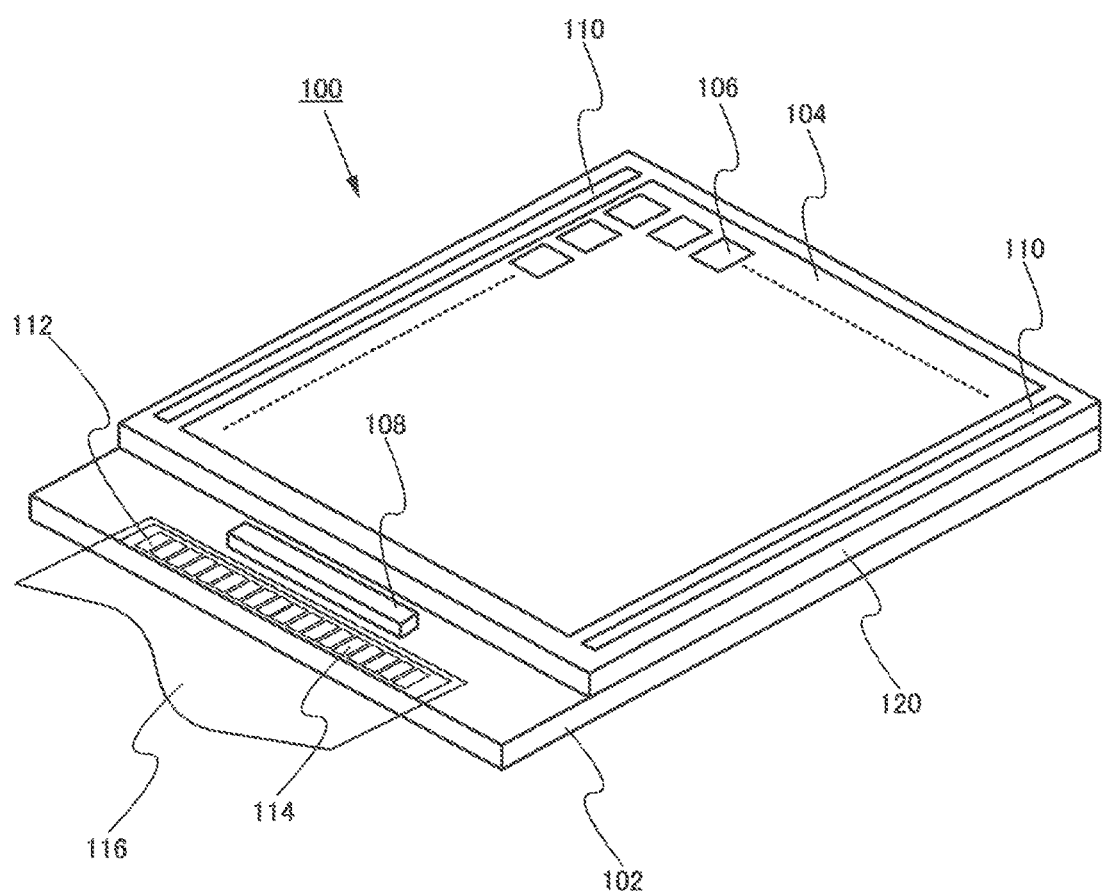
FIG. 1 is a perspective view showing a structure of a display device related to one embodiment of the present invention.

An embodiment of the present invention is described below with reference to the drawings and the like. Note, however, that the present invention may be carried out in many different aspects and should not be narrowly interpreted within the limits of the contents of description of the embodiment illustrated below. For a clearer description, the drawings may schematically show the width, thickness, shape, and the like of each component in comparison with actual aspects; however, they are mere examples and, as such, are not intended to limit the interpretation of the present invention. Further, in the present specification and each of the drawings, elements that are identical to those previously described with reference to a preceding drawing are given the same reference numerals (or reference numerals each with a letter such as "a" or "b" added to the end of a number), and a detailed description of such elements may be omitted as appropriate. Furthermore, a word "first" or "second" added to the beginning of an element is a convenient mark that is used for identifying the element, and means nothing more than that unless otherwise noted.

In the present specification, unless otherwise noted, cases where a member or region is located "over (or under)" another member or region encompass not only cases where a member or region is located immediately above (or immediately below) another member or region but also cases where a member or region is located above (or below) another member or region, i.e. cases where another constituent element is inserted above (or below) another member or region. It should be noted that, unless otherwise noted, the following description assumes that, in a cross-sectional view, the side of a first substrate on which a second substrate is arranged is referred to as "over" or "above" and the opposite side is referred to as "under" or "below".

FIG. 1 shows a perspective view of a display device 100 related to one embodiment of the present invention. The display device 100 is arranged with a pixel part 104, first drive circuit 108 and second drive circuit 110 in a first substrate 102. The pixel part 104 is arranged with a plurality of pixels 106. The first drive circuit 108 is a circuit for outputting a video signal to the pixel part 104. The first drive circuit 108 is a semiconductor chip called a driver IC for example and is mounted on the first second substrate 102. The second driver circuit 110 is a circuit for outputting a scanning signal to the pixel part 104. The pixel part 104 is sealed by a sealing member 120.

A terminal part 112 arranged with a terminal electrode 114 is disposed in the first substrate 102. The terminal part 112 is arranged in a region sealed by the sealing member 120 at an end part of the first substrate 102. The terminal part 112 is connected with a FPC substrate 116 via an ACF. The FPC substrate 116 connects the display device 100 with other function circuits or external devices. The terminal part 112 is input with a video signal and the like via the FPC substrate 116.

A glass substrate or organic resin substrate is used for the first substrate 102. A polyimide substrate for example may be used an organic resin substrate. An organic resin substrate can be formed to a thickness from a few micrometers to a few tens of micrometers and a sheet display can be realized having flexibility. Even in the case where the first substrate has flexibility, the terminal part 112 of the display device 100 requires an adhesion surface for securely connecting to the FPC substrate 116. The display device 100 related to the present embodiment is arranged with a convex-concave shape in the terminal electrode 114 as is described herein.

Figure 2:
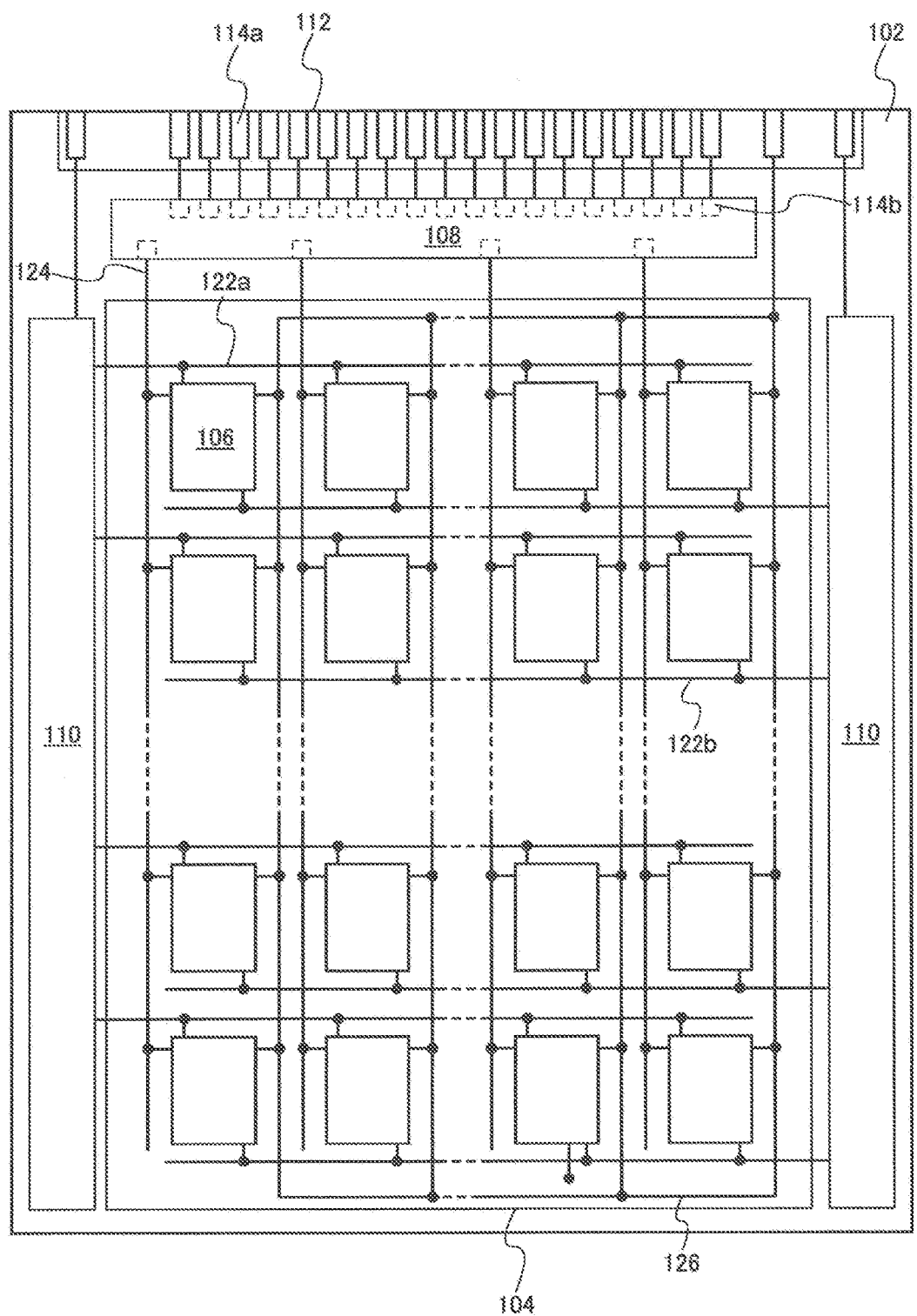
FIG. 2 is a diagram showing a functional circuit structure of a display device related to one embodiment of the present invention.

FIG. 2 shows a functional circuit structure of the display device 100. A plurality of terminal electrodes 114 is arranged in the terminal part 112 at certain intervals. A terminal electrode 114 is connected with wiring which links to the first drive circuit 108 and second drive circuit 110. Although FIG. 2 shows an aspect in which the terminal part 112 is aligned with one end of the first substrate 102, the present invention is not limited to this aspect. For example, the terminal part 112 may be arranged divided into a plurality of sections of the first substrate 102, or arranged not at end part of the first substrate 102 but in an interior region. In addition, the arrangement of the terminal electrodes 114 is arbitrary and adjacent terminal electrodes may be mutually arranged differently.

A terminal electrode 114b arranged in a mounting surface of the first drive circuit 108 is shown by the dotted line in FIG. 2. When the first drive circuit 108 is realized by a driver IC, the terminal electrode 114b serves as a component for connecting with bump of the driver IC. In the present specification, in the case where a terminal electrode connected to the FPC substrate 106 and a terminal electrode connected to the driver IC are distinguished and referred to, the former is referred to as a first terminal electrode 114a and the latter is referred to as a second terminal electrode 114b, and in other cases, it is collectively referred to as terminal electrode 114.

Although the first terminal electrode 114a and second terminal electrode 114b are arranged above the first substrate 102. The first terminal electrode 114a and second terminal electrode 114b are flat shaped and include different areas in a connection part, but they have essentially the same structure. That is, the upper surface of a terminal electrode 114 has a convex-concave shape.

The pixel part 104 is arranged with a plurality of pixels 106 in a row direction and a column direction. The arrangement number of the pixels 106 is arbitrary. For example, m number of pixels 106 are arranged in a row direction (X direction) and n number of pixels 106 are arranged in a column direction (Y direction). A display element is arranged in a pixel 106. A light emitting element (organic electroluminescence element) or liquid crystal element and the like are used as the display element. A first scanning signal line 122a and second scanning signal line 122b are arranged in a row direction and a video signal line 124 is arranged in a column direction in a pixel part 104. In addition, a power supply line 126 is arranged in a pixel part 104. Furthermore, although FIG. 2 shows an example of pixels 106 in a square arrangement, the present invention is not limited to this and a delta arrangement or other arrangement shape may be used.

The first drive circuit 108 outputs a video signal to the video signal line 124. The second drive circuit 110 arranged adjacent to a pixel part 104 outputs a signal to the first scanning signal line 122a and second scanning signal line 122b. A signal for operating the first drive circuit 108 and the second drive circuit 110 is input to each terminal electrode 114 in the terminal part 112. In the case where a power supply line 126 is arranged in a pixel part 104, a terminal electrode connected to the power supply line 126 is included in the terminal part 112. Furthermore, the structure of the first substrate 102 shown in FIG. 2 is an example, the structure of a drive circuit, scanning signal line, video signal line and power supply line are all arbitrary and other structures may be included.

Figure 3A:
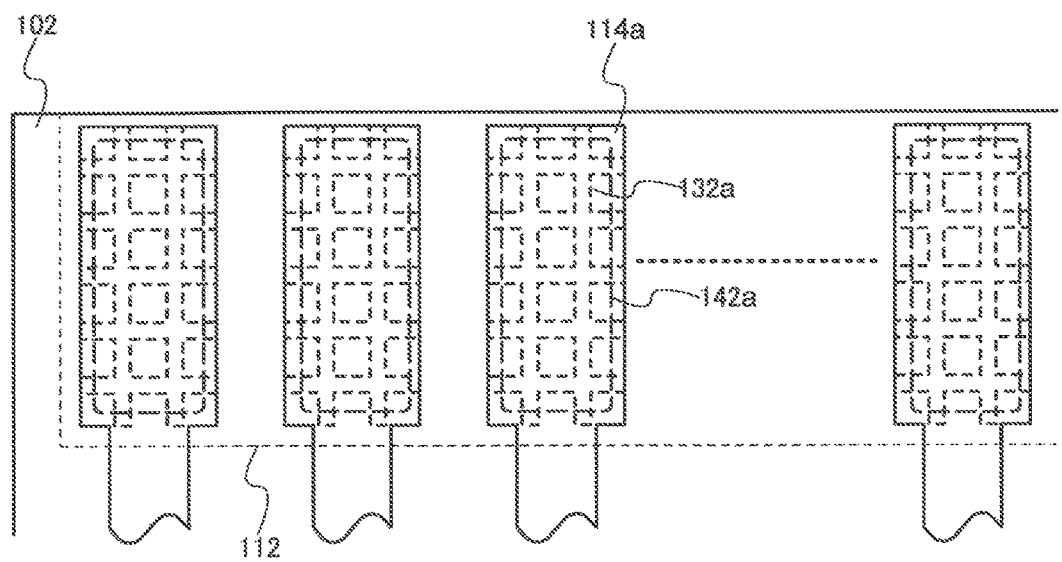
FIG. 3A is a planar view diagram showing a structure of a terminal part of a display device related to one embodiment of the present invention, and shows a terminal electrode connected to a FPC substrate.

FIG. 3A shows an arrangement of a first terminal electrode 114a in a terminal part 112. A plurality of first terminal electrodes 114a is arranged at an end part of the first substrate 102. An end part of the first terminal electrode 114a is covered by an insulating layer and a region on the inner side of a first aperture end 142a is exposed. A convex-concave shape is arranged in the upper surface part, that is, an exposed surface of the first terminal electrode 114a as shown by the dotted line. The upper surface part of the first terminal electrode 114a is arranged with a convex-concave shape so that a lattice pattern 132a shown by the dotted line serves as a convex part for example.

Figure 3B:
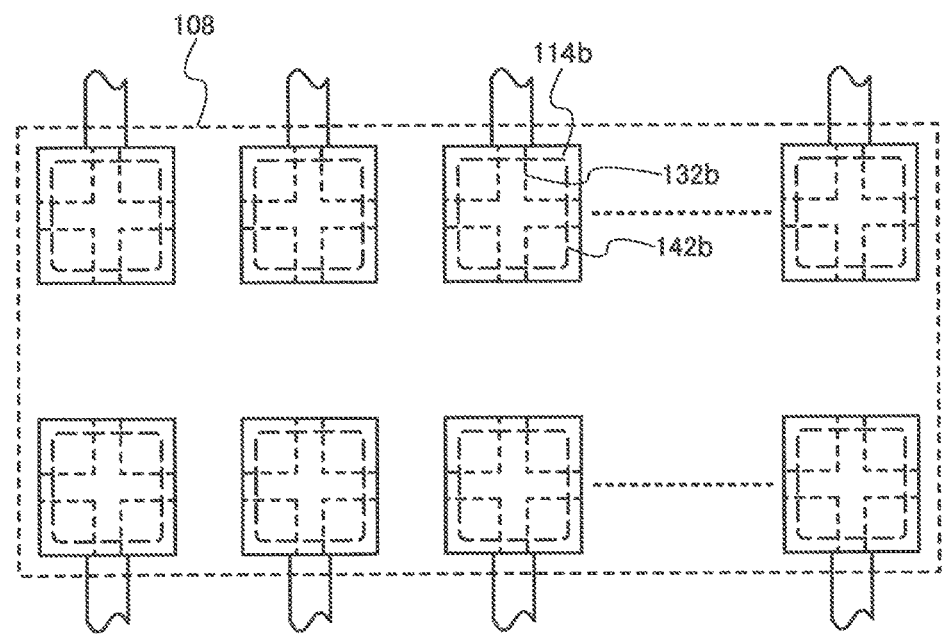
FIG. 3B is a planar view diagram showing a structure of a terminal part of a display device related to one embodiment of the present invention, and shows a terminal electrode connected to a driver IC.

FIG. 3B shows an arrangement of a second terminal electrode 114b in a terminal part 112. The second terminal electrode 114b is arranged in a region arranged with the first drive circuit 108. An end part of the second terminal electrode 114b is also covered by an insulating layer the same as the first terminal electrode 114a, and a region on the inner side of a second aperture end 142b is exposed. The second terminal electrode 114b also have a convex-concave shape formed by a second underlying structure layer 132b on the upper surface part as the same as the first terminal electrode 114a.

Figure 4:
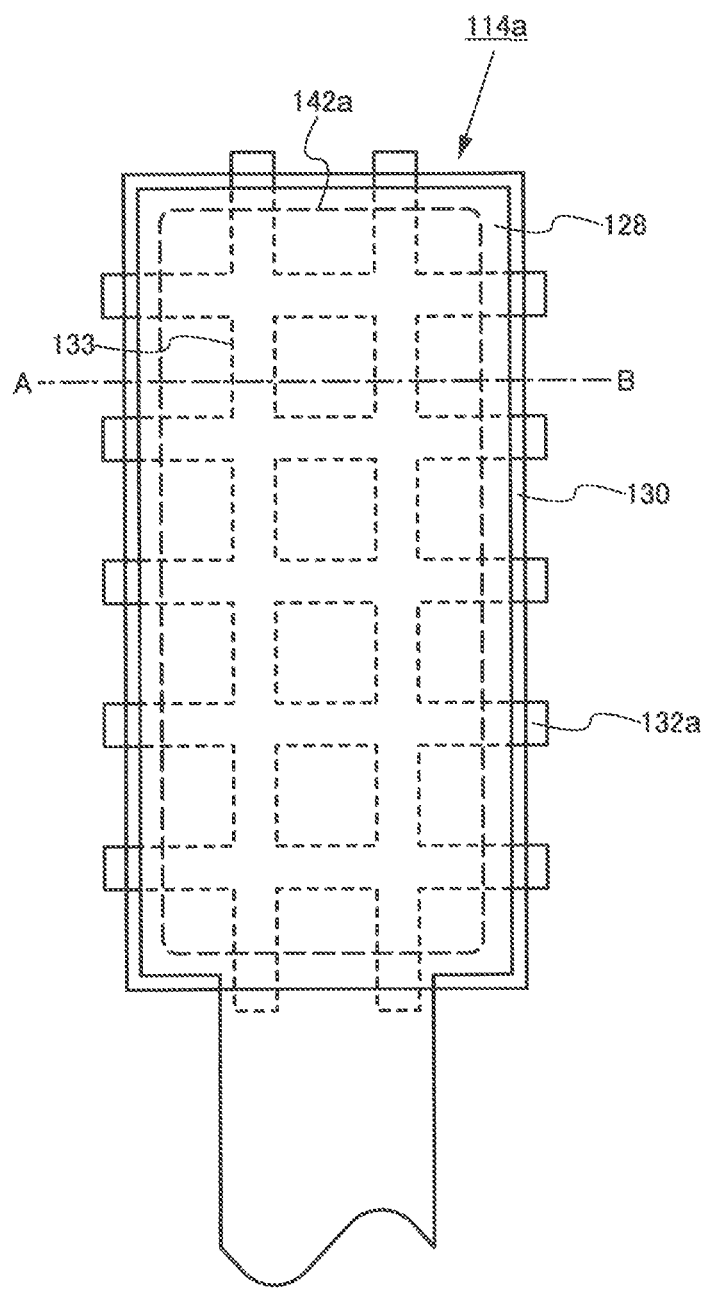
FIG. 4 is a planar view diagram showing a structure of a terminal electrode of a display device related to one embodiment of the present invention.
Figure 5A:
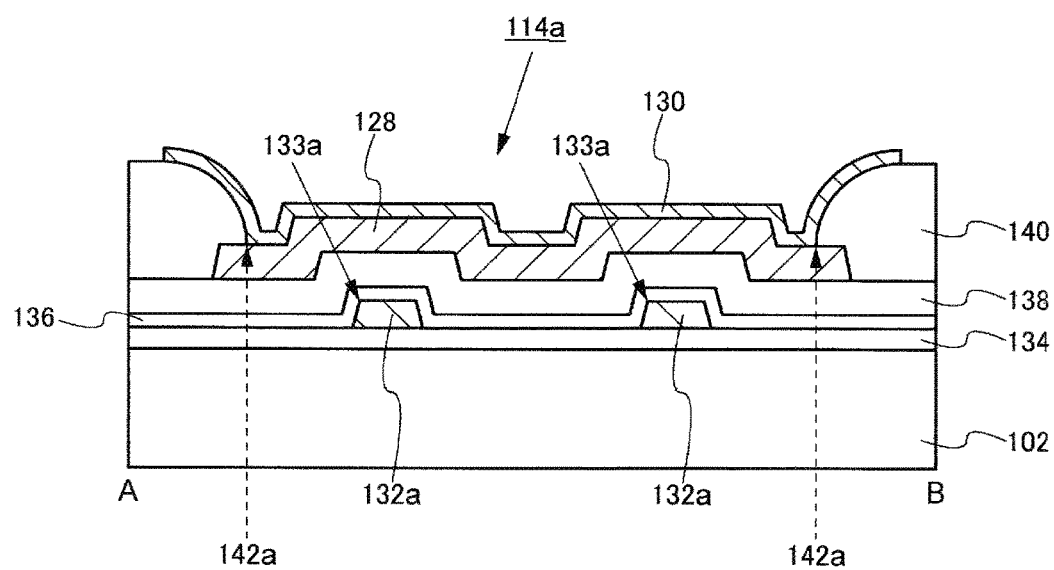
FIG. 5A is a cross-sectional diagram showing a structure of a terminal electrode of a display device related to one embodiment of the present invention, and shows a first cross-sectional aspect.
Figure 5B:
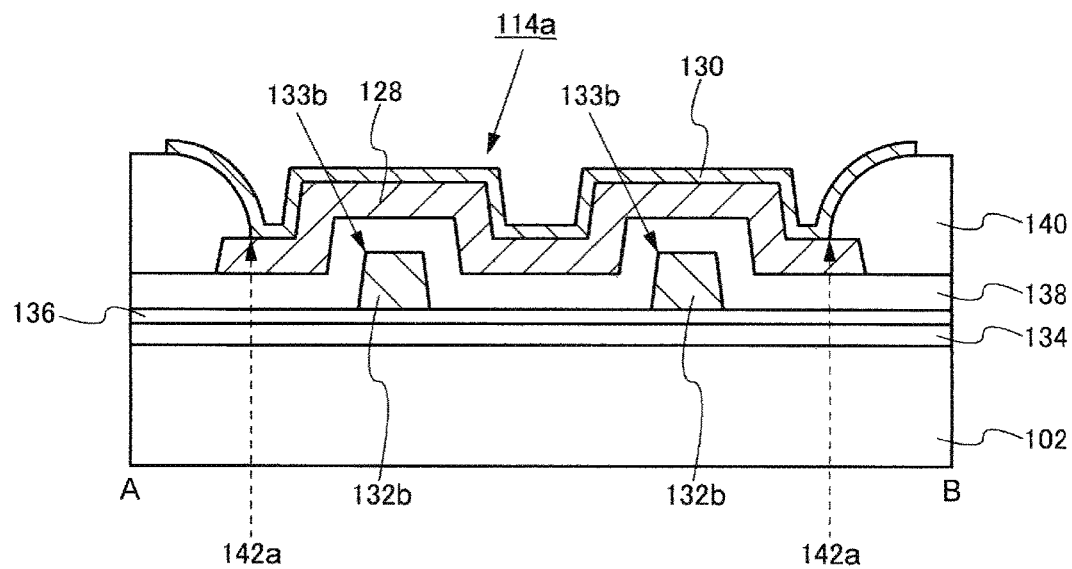
FIG. 5B is a cross-sectional diagram showing a structure of a terminal electrode of a display device related to one embodiment of the present invention, and shows a second cross-sectional aspect.

FIG. 4 shows a planar view of the first terminal electrode 114a. In addition, a cross-sectional structure along the line A-B shown in FIG. 4 is shown in FIG. 5A and FIG. 5B. A terminal electrode is explained in detail below while referring to these two diagrams.

The first terminal electrode 114a is formed by a first conducting layer 128 and second conducting layer 130. The first conducting layer 128 includes one or a plurality of metal layers. For example, the first conducting layer 128 has a structure including an aluminum layer and a titanium layer arranged on one or both surfaces of the aluminum layer. The second conducting layer 130 is a conductive metal oxide. For example, the second conducting layer 130 is formed from conductive metal oxide such as ITO (Indium Tin Oxide) or IZO (Indium Zinc Oxide).

Furthermore, the first conducting layer 128 has a thickness of 200 nm~2000 nm in the first terminal electrode 114a, and is formed to a thickness of 500 nm~1000 nm for example. In addition, the second conducting layer 130 has a thickness of 50 nm~500 nm and is formed to a thickness of 100 nm~250 nm for example.

At least one insulating layer is arranged on the bottom side of the first terminal electrode 114a. FIG. 5A shows a first cross-sectional aspect and shows a first insulating layer 134, second insulating layer 136 and third insulating layer 138 arranged between the first substrate 102 and first terminal electrode 114a. By arranging at least one insulating layer between the first substrate 102 and first terminal electrode 114a, it is possible to increase adhesion to a bottom surface of the first terminal electrode 114a even when the first substrate 102 is an organic resin substrate.

An end part of the first terminal electrode 114 is covered by a fourth insulating layer 140. In other words, the fourth insulating layer 140 includes an aperture part and the first aperture part 142a is arranged above the first terminal electrode 114a and first conducting layer 128. The fourth insulating layer 140 is formed from an organic insulation material. An end part of the first conducting layer 128 is protected by being covered by the fourth insulating layer 140. In addition, short circuits with an adjacent terminal electrode are prevented by this structure. The second conducting layer 130 is arranged along a surface of the fourth insulating layer 140 from an upper surface of the first conducting layer 128. In this way, a surface of the first conducting layer 128 is covered by the fourth insulating layer 140 and second conducting layer 130. Since the conducting layer 130 is hard compared to the first conducting layer 128, damage due to contact pressure of conductive particles is prevented even when an ACF is arranged on an upper surface of the first terminal electrode 114a. In addition, insulation of a surface due to metal oxidation (for example, aluminum oxidation) is prevented by arranging the second conducting layer 130 formed from a conductive metal oxide on an uppermost surface of the first terminal electrode 114a. In this way, a good connection with a FPC substrate is formed.

An underlying structure layer 132 including a surface formed by an inclined surface and a flat surface is arranged between the first conducting layer 128 and first substrate 102. Specifically, the underlying structure layer 132 is arranged between either of the first insulating layer 134, second insulating layer 136 and third insulating layer 138 or between the first substrate 102 and the first insulating layer 134. The underlying structure layer 132 includes a surface 133 formed from at least one inclined surface and flat surface, and is arranged so that the surface 133 formed from the inclined surface and flat surface is arranged within an aperture part (inner side of the first aperture end 142a) of the first terminal electrode 114a.

FIG. 5A shows a first underlying structure layer 132a arranged between the first insulating layer 134 and second insulating layer 136. In addition, FIG. 5B shows a second cross-sectional aspect in which a second underlying structure layer 132 is arranged between the second insulating layer 136 and third insulating layer 138. The second insulating layer 136 and third insulating layer 138 arranged on an upper layer side of the first underlying structure layer 132a are inorganic insulation films such as a silicon oxide film, silicon nitride film or silicon oxynitride film and the like. As a result, the second insulating layer 136 and third insulating layer 138 are formed along a surface 133 formed by an inclined surface and flat surface of the first underlying structure layer 132a. Therefore, a bottom surface of the first conducting layer 128 includes a convex-concave shape which reflects the shape of the surface 133 formed by an inclined surface and flat surface. This convex-concave shape appears as the surface shape of the first conducting layer 128. Since the second conducting layer 130 arranged above the first conducting layer 128 has a thinner film thickness than the first conducting layer 128 as described previously, a convex-concave shape is provided to the surface of the first terminal electrode 114a as a result.

Furthermore, since the underlying structure layer 132 is buried in an insulating layer, it is formed from an arbitrary material. FIG. 5A shows an example in which the first underlying structure layer 132a is formed from a semiconductor layer. In addition, FIG. 5B shows an example in which the second underlying structure layer 132b is formed from a metal layer. In either case, the underlying structure layer 132 is arranged so that at least one end part overlaps the first terminal electrode 114a. In addition, the surface 133 which is formed by an inclined surface and flat surface having the film thickness of the underlying structure layer 132 is arranged so that at least one is included in a region which overlaps the first terminal electrode 114a. That is, in FIG. 5A, a step is formed having a height corresponding to the film thickness of a semiconductor layer which forms the first underlying structure layer 132a, and in FIG. 5B, a step is formed having a height corresponding to the film thickness of a metal layer which forms the second underlying structure layer 132b. FIG. 5A shows the first underlying structure layer 132a having a surface 133a formed by an inclined surface and flat surface, and FIG. 5B shows the second underlying structure layer 132b having a surface 133b formed by an inclined surface and flat surface.

Figure 6:
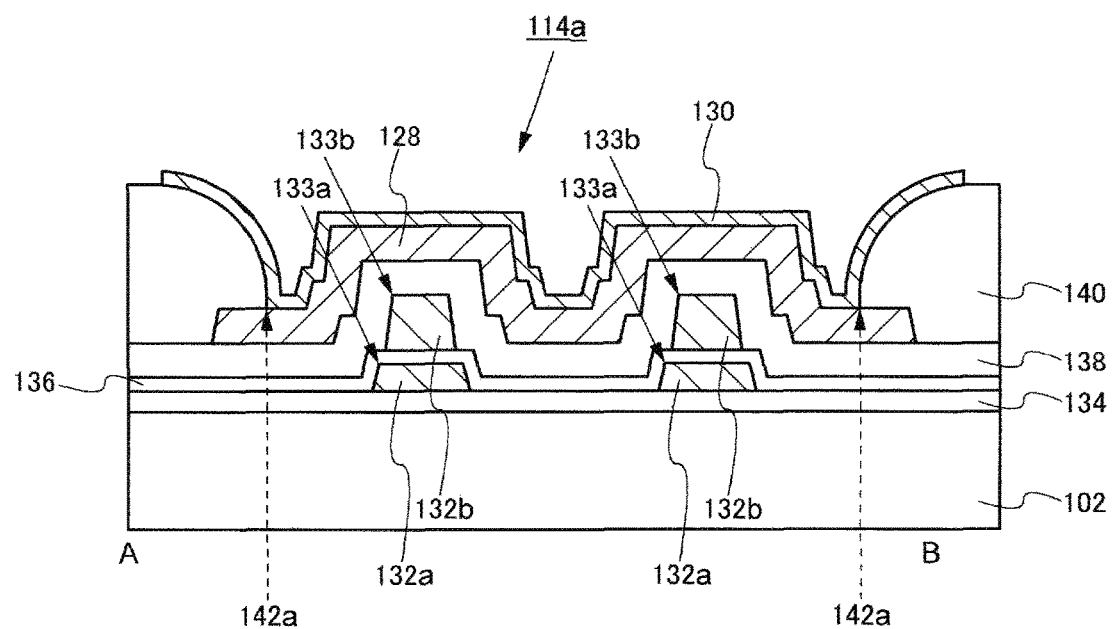
FIG. 6 is a cross-sectional diagram showing a structure of a terminal electrode of a display device related to one embodiment of the present invention, and shows a third cross-sectional aspect.

In addition, FIG. 6 shows a third cross-sectional aspect and shows the first underlying structure layer 132a overlapping the second underlying structure layer 132b. In this case, for example, the first underlying structure layer 132a is formed from a semiconductor layer and the second underlying structure layer 132b is formed from a metal layer. In this way, by stacking underlying structure layers formed from different layers, it is possible to further increase the height of a surface formed by an inclined surface and flat surface.

Furthermore, although FIG. 5A, FIG. 5B and FIG. 6 show an example in which the underlying structure layer 132 is arranged using a semiconductor layer or metal layer, the present invention is not limited to this structure. For example, the underlying structure layer may be arranged using an insulating layer formed into a certain pattern which allows a surface formed by an inclined surface and flat surface to be formed.

FIG. 4 shows an example in which a planar shape of the underlying structure layer 132 is arranged in a lattice pattern. That is, the underlying structure layer 132 includes a lattice pattern which exposes a bottom surface. In this way, a surface formed by a plurality of inclined surfaces and flat surfaces is arranged in a region where the first conducting layer 128 and second conducting layer 130 overlap. Surface area increases by forming this type of convex-concave shape in the surface of the first terminal electrode 114a. That is, the contact area of an ACF arranged above the first terminal electrode 114a increases and it is possible to increase adhesive strength. In addition, since the contact area with conductive particles included in an ACF also increases, the effect of reducing contact resistance is further provided.

Figure 7:
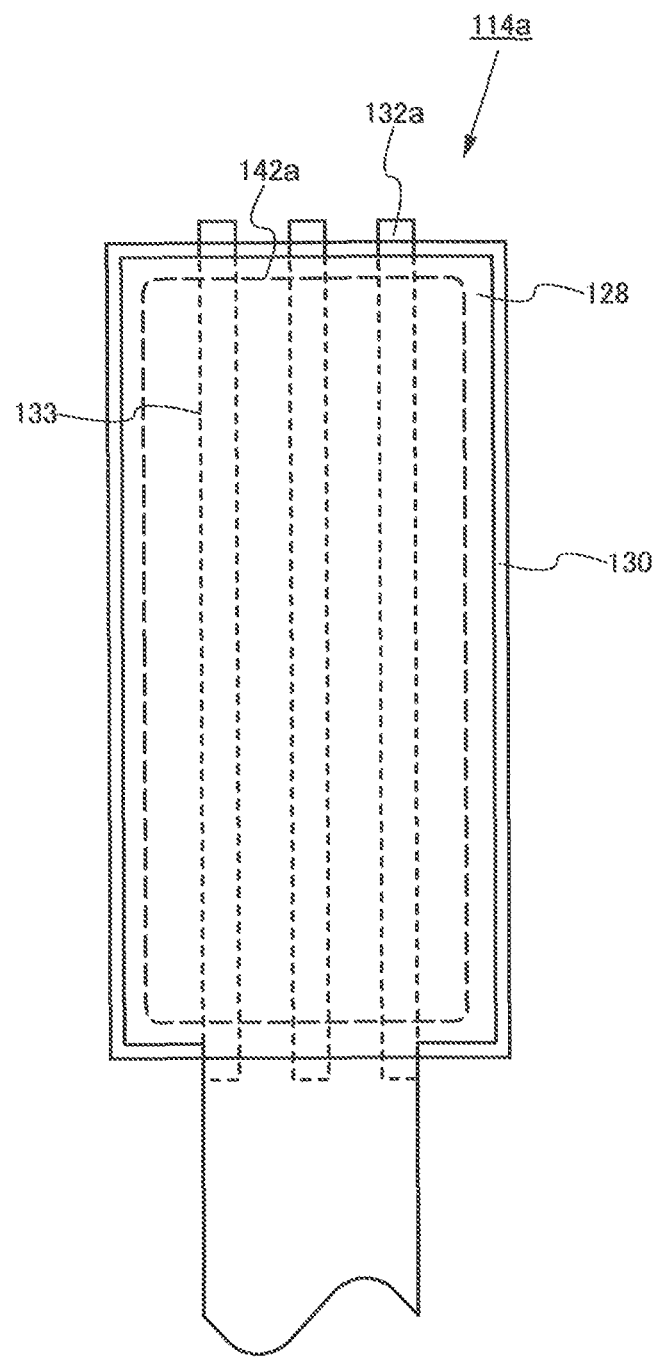
FIG. 7 is a planar view diagram showing a structure of a terminal electrode of a display device related to one embodiment of the present invention.

FIG. 7 shows an example in which a planar shape of the underlying structure layer 132 is arranged in a stripe shaped pattern. Even when the underlying structure layer 132 has a stripe shaped pattern, it is possible to form the surface of the first terminal electrode 114a into a convex-concave shape. Although FIG. 7 shows the stripe shaped pattern of the underlying structure layer 132 being arranged along the length direction of the first terminal electrode 114a, the direction in which the stripe shaped pattern is arranged is not limited to the length direction. For example, the pattern of the underlying structure layer 132 may also be arranged in a direction intersecting the length direction of the first terminal electrode 114a.

Figure 8:
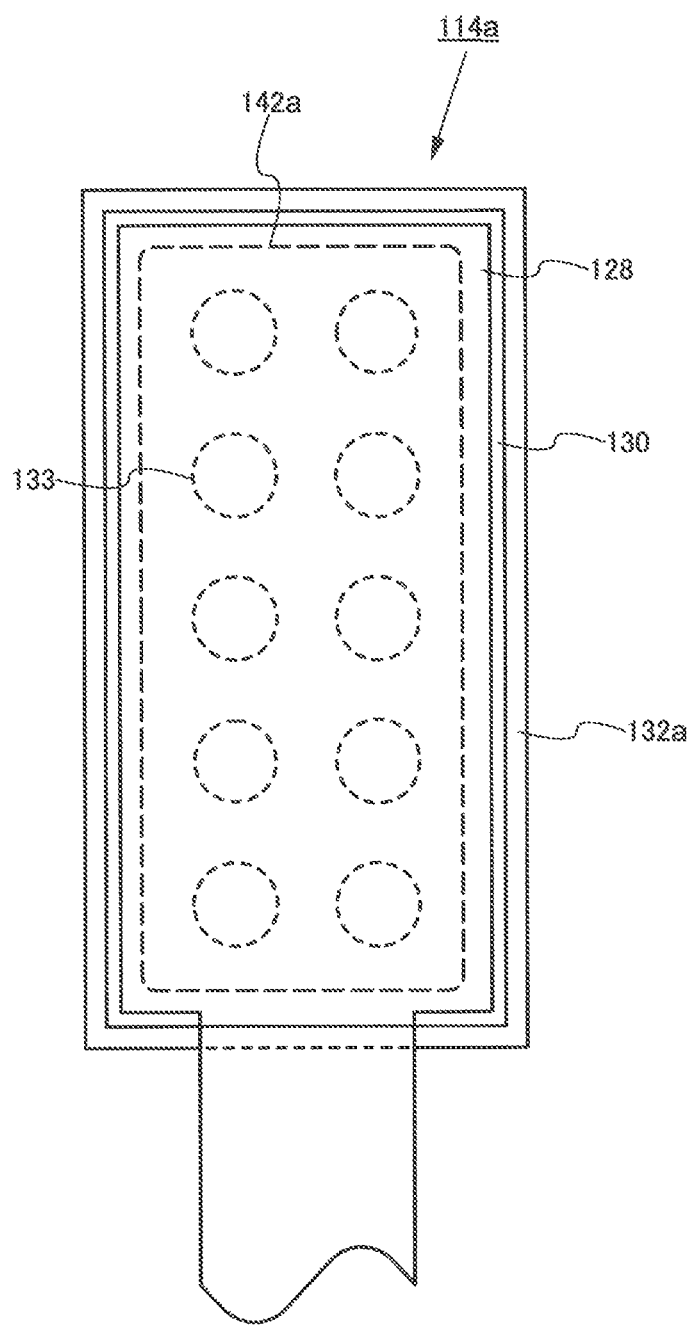
FIG. 8 is a planar view diagram showing a structure of a terminal electrode of a display device related to one embodiment of the present invention.
Figure 9:
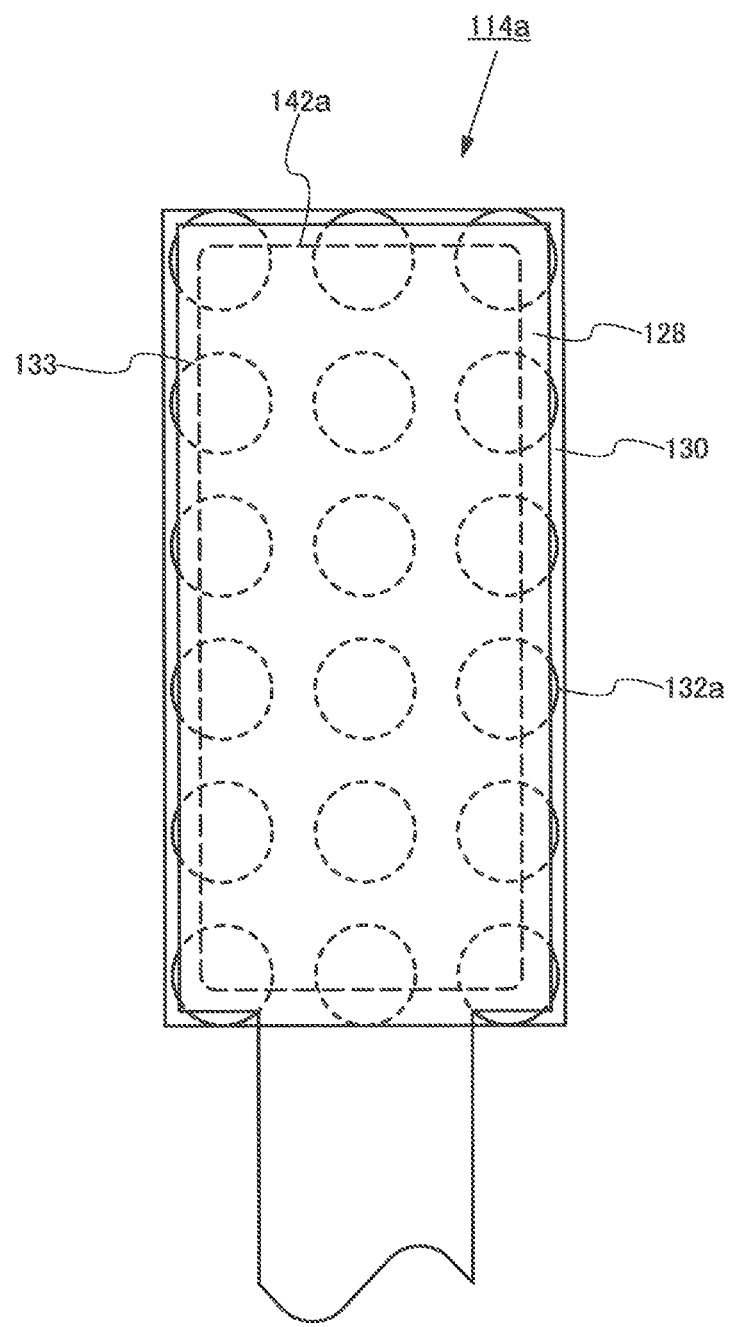
FIG. 9 is a planar view diagram showing a structure of a terminal electrode of a display device related to one embodiment of the present invention.

FIG. 8 shows a through hole arranged in the underlying structure layer 132 overlapping the first terminal electrode 114a. By arranging an aperture part which passes through the underlying structure layer 132 in a region which overlaps the first terminal electrode 114a, it is possible to form the surface 133 which is formed by an inclined surface and flat surface having the film thickness of the underlying structure layer 132. On the other hand, as is shown in FIG. 9, the underlying structure layer 132 may be formed with an island shaped pattern. That is, by arranging the underlying structure layer 132 with a discrete island shaped pattern in a region which overlaps the first terminal electrode 114a, it is possible to form the surface 133 which is formed by an inclined surface and flat surface having the film thickness of an island shaped region. Furthermore, a planar aspect of a through hole or island shaped pattern in the structure of the underlying structure layer 132 is not limited to the circle shown in FIG. 8 and FIG. 9, a polygon larger than a triangle, an ellipse or shape formed by a straight line or curved line or a shape formed by a plurality of curved lines is also possible.

In this way, according to one embodiment of the present invention, by arranging the underlying structure layer 132 including at least one end part in region overlapping the first terminal electrode 114a, it is possible to provide the surface of the first terminal electrode 114a with a convex-concave shape. Therefore, it is possible to increase the surface area of the first terminal electrode 114a. That is, according to the present embodiment, it is possible to provide the surface of the first terminal electrode 114a with a convex-concave shape even if no special processing is performed on that surface. In this case, since the underlying structure layer 132 is buried in an insulating layer, short circuits between adjacent terminal electrodes are prevented even when the underlying structure layer 132 is provided with conductivity. Therefore, the underlying structure layer 132 can be arranged with a pattern which is continuous across a plurality of electrodes in the terminal part 112.

Furthermore, although FIG. 4 to FIG. 9 explained the first terminal electrode 114a being arranged in an end part of the first substrate 102, the same structure can be applied with respect to the second terminal electrode 114b which is connected with the first drive circuit 108.

Figure 10:
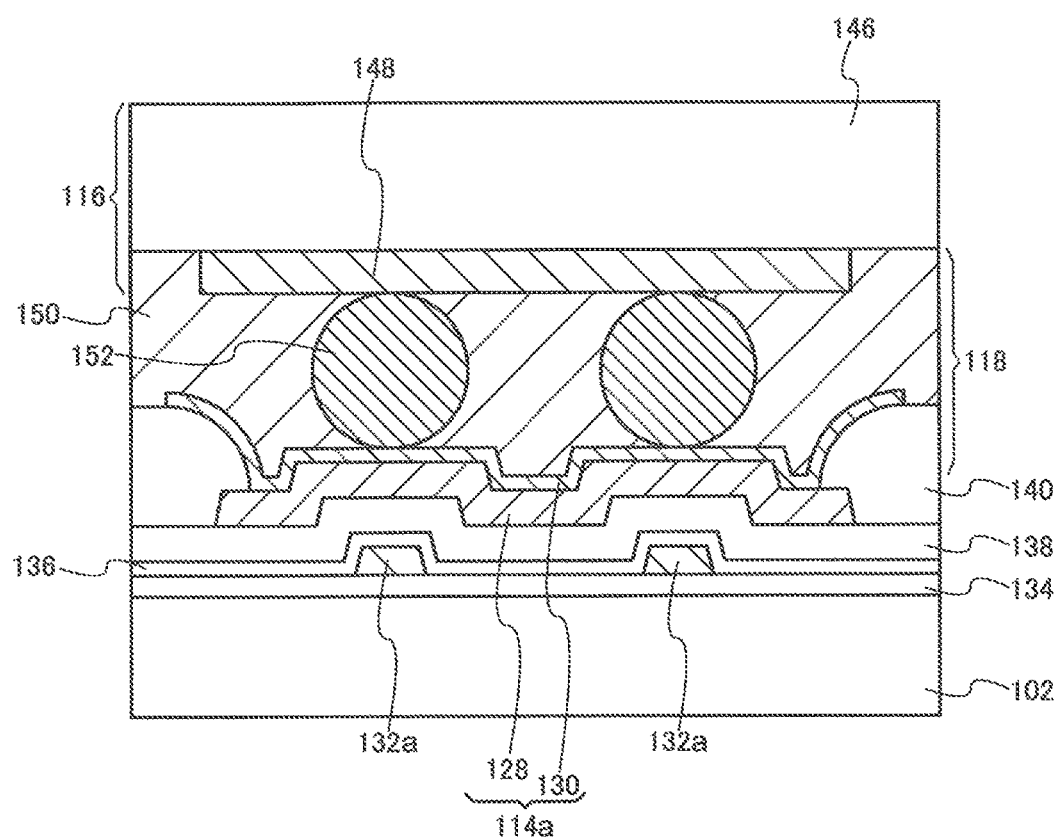
FIG. 10 is a cross-sectional diagram showing a connection structure between a terminal electrode and a FPC substrate of a display device related to one embodiment of the present invention.

FIG. 10 shows a connection structure between the first terminal electrode 114a and a FPC substrate 116 using a cross-sectional diagram. The FPC substrate 116 includes a structure in which metal wiring 148 is arranged in a resin film substrate 146. The FPC substrate 116 is arranged so that the metal wiring 148 opposes the first terminal electrode 114a. An ACF 118 is arranged between the first terminal electrode 114a and FPC substrate 116. The ACF 118 includes a structure in which conductive particles 152 are dispersed within a resin layer 150. The first terminal electrode 114a and FPC substrate 116 are electrically connected via the conductive particles 152. Specifically, an electrical connection is formed between the second conducting layer 130 and metal wiring 148 by contact with the conductive particles 152.

The resin layer 150 of the ACF 118 is a thermosetting resin for example, and the first terminal electrode 114a and FPC substrate 116 are adhered together by hardening. In this case, the contact area with the resin layer 150 is increased by providing the surface of the first terminal electrode 114a with a convex-concave shape. Therefore, it is possible to increase the adhesive strength between the ACF 118 and first terminal electrode 114a, and prevent the FPC substrate 116 from peeling away.

Figure 11:
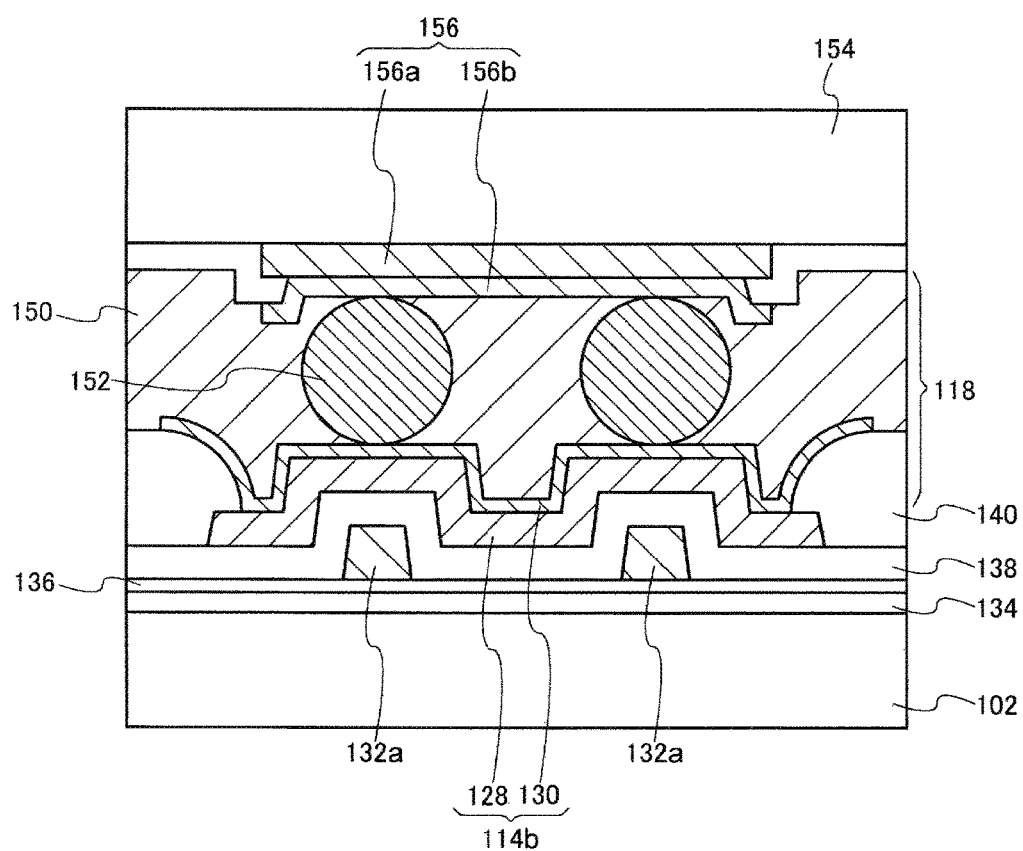
FIG. 11 is a cross-sectional diagram showing a connection structure between a terminal electrode and a driver IC of a display device related to one embodiment of the present invention.

FIG. 11 shows a connection structure between the second terminal electrode 114b and a driver IC 154 arranged as the first drive circuit 108 using a cross-sectional diagram. The driver IC 154 is arranged so that a terminal electrode 156 (including a first terminal electrode layer 156a and a second terminal electrode layer 156b) opposes the second terminal electrode 114b. The ACF 118 is arranged between the second terminal electrode 114b and driver IC 154. The second terminal electrode 114b and driver IC 154 are electrically connected via conductive particles 152. Specifically, an electrical connection is formed between the second conducting layer 130 and the terminal electrode 156 by contact with the conductive particles 152. In this case, the contact area with the resin layer 150 is increased by providing the surface of the second terminal electrode 114b with a convex-concave shape. Therefore, it is possible to increase the adhesive strength between the ACF 118 and second terminal electrode 114b, and prevent the driver IC 154 from peeling away or prevent an increase in electrical resistance of a connection part.

The underlying structure layer 132 arranged to overlap the terminal electrode 114 can be manufactured using components which form a pixel 106 of the display device 100. A cross-sectional structure of a pixel 106 is explained while referring to FIG. 12 in order to explain the relationship between the underlying structure layer 132 and components which form a pixel 106.

Figure 12:
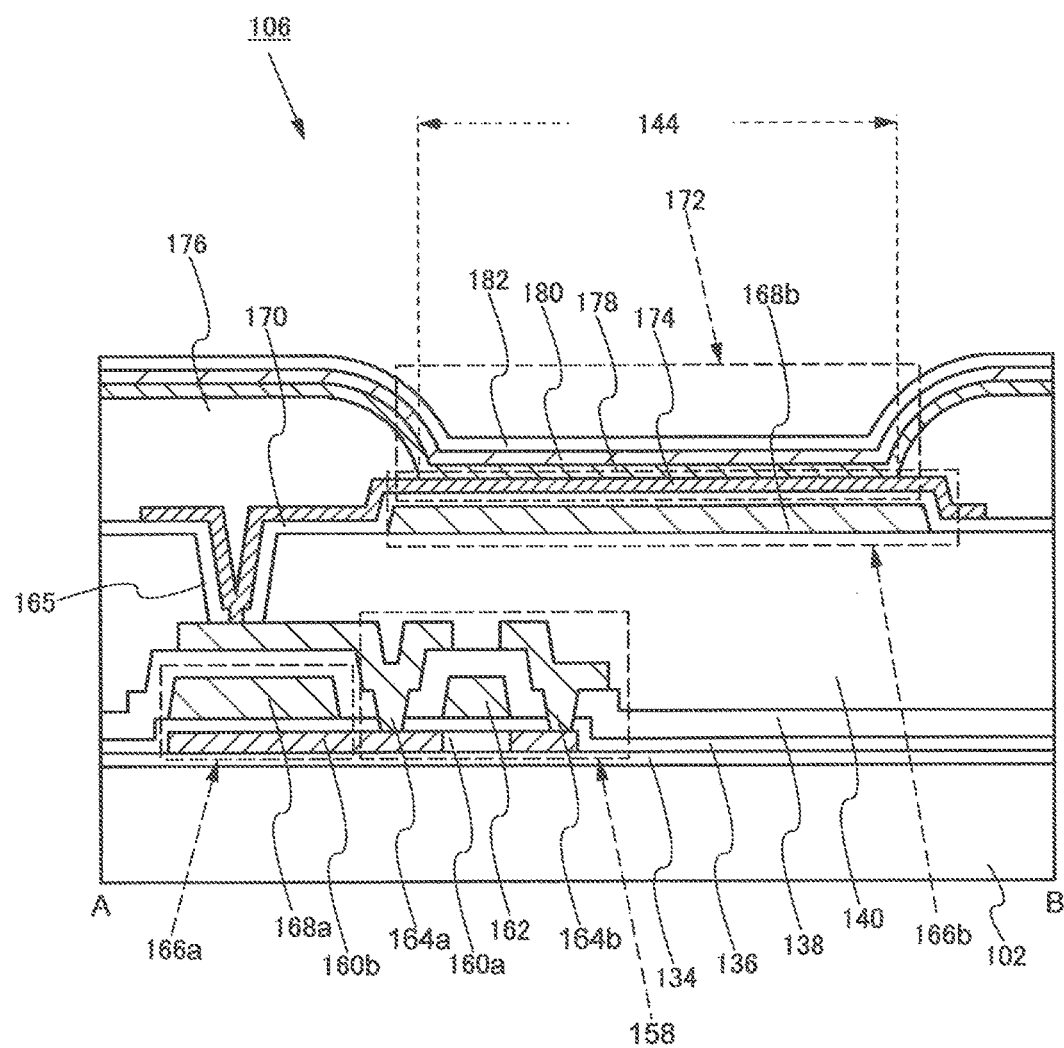
FIG. 12 is a cross-sectional diagram showing a structure of a pixel of a display device related to one embodiment of the present invention.

As is shown in FIG. 12, a pixel 106 includes a transistor 158, a first capacitor element 166a, a second capacitor element 166b, and display element 172. The transistor 158 is arranged above the first insulating layer 134. The transistor 158 includes a structure in which a semiconductor layer 160a, second insulating layer 136 which functions as a gate insulating film, and a gate electrode 162 are stacked. The semiconductor layer 160a is formed from a silicon semiconductor material such as amorphous silicon or polysilicon, and a metal oxide ("oxide semiconductor") which exhibits semiconductor properties, and is arranged above the first insulating layer 134. The semiconductor layer 160a includes a pattern separated into island shapes corresponding to the arrangement of the transistor 158, and is arranged at a thickness of 50 nm.about.500 nm. The semiconductor layer 160a is covered by the second insulating layer 136.

The gate electrode 162 is arranged including a region overlapping the semiconductor layer 160a via the second insulating layer 136 which functions as a gate insulating film. The gate electrode 162 is formed from a metal film such as aluminum, titanium, molybdenum or tungsten and the like, and includes a structure in which titanium and aluminum are stacked for example. The gate electrode 162 has a thickness of approximately 100 nm~1000 nm. The second insulating layer 136 is formed from an inorganic insulation material, for example, a silicon oxide film, silicon nitride film or silicon oxynitride film may be used. For example, if the semiconductor layer 160a is formed from polysilicon, a silicon oxide film can be favorably used as the second insulating layer 136.

The third insulating layer 138 is arranged in an upper layer of the gate electrode 162. The gate electrode 138 is manufactured from an inorganic insulation material, and includes a structure in which a single layer or plurality of layers of a silicon oxide film or silicon nitride film are stacked for example. The third insulating layer 138 is arranged to have a thickness of approximately 500 nm~2000 nm.

The second insulating layer 136 and third insulating layer 138 are inorganic insulation films manufactured by a thin film manufacturing technique such as a plasma CVD (Chemical Vapor Deposition) method or sputtering method and the like. A thin film of this type of inorganic insulation film grows according to an underlying convex-concave shape. Therefore, when the semiconductor layer 160 or the gate electrode 162 has a step structure, the surface shape of an insulating layer deposited thereupon becomes a shape including a step structure.

A source/drain wiring 164a and 164b are arranged above the third insulating layer 138. The source/drain wiring 164a and 164b are formed from a metal film such as titanium, molybdenum or aluminum and the like, and include a structure in which a titanium film is sandwiched between upper and lower layers of an aluminum film for example. A fourth insulating layer 140 is arranged above the source/drain wiring 164a and 164b. The fourth insulating layer 140 is manufactured from an organic insulation material. Acrylic or polyimide and the like may be used as the organic insulation material. The fourth insulating layer 140 is manufactured using a spin coating method or vapor deposition polymerization method and the like. By using these film formation methods, the fourth insulating layer 140 covers an underlying convex-concave shape (step structure) and it is possible to obtain a flat surface. That is, the fourth insulating layer 140 can be used as a planarization film.

A display element 172 is arranged above the fourth insulating layer 140. FIG. 12 shows the case where the display element 172 is a light emitting element. That is, the display element 172 includes a structure in which a pixel electrode 174, organic layer 178 and counter electrode 180 are stacked. The pixel electrode 174 is electrically connected with the source/drain wiring 164a via a contact hole 165 arranged in at least the fourth insulating layer 140. That is, the pixel electrode 174 is electrically connected with the transistor 158 via the source/drain wiring 164a.

A region arranged with a periphery edge part of the pixel electrode 174 and the contact hole 165 is covered by a sixth insulating layer 176. The sixth insulating layer 176 is arranged in an upper layer of the pixel electrode 174 and includes an aperture part 144 which exposes an inner side region of the pixel electrode 174. The organic layer 178 and counter electrode 180 are arranged from an upper surface of the pixel electrode 174 to an upper surface of the sixth insulating layer 176.

The organic layer 178 is formed from a single layer or a plurality of layers and includes an organic electroluminescence material. The counter electrode 180 is arranged in an upper layer of the organic layer 178 and a seventh insulating layer 182 is included as a passivation layer in an upper layer of the counter electrode 180. The seventh insulating layer 182 includes a single layer of a silicon nitride film, stacked layers of a silicon nitride film and silicon oxide film, and a stacked layer structure of a silicon nitride film and organic insulation film. In the present embodiment, the display device 100 is what is called a top emission type device which emits light to the counter electrode 180 side. At this time, the pixel electrode 174 which serves as a reflecting electrode has a structure in which light emitted by the organic layer 178 is reflected due to the stacked structure of a transparent conductive film and a metal film. For example, the pixel electrode 174 includes at least two layers of a transparent conductive film, and a metal film (for example, a material with high reflectance such as silver (Ag) or aluminum (Al) is preferred) sandwiched between the two layers of transparent conductive film. The counter electrode 180 is formed by a transparent conducive film such as indium tin oxide and allows the light emitted by the organic layer 178 to pass through.

The first capacitor element 166a is formed by a first capacitor electrode 168a formed in the same layer as the gate electrode 162, and a semiconductor layer 160b included with impurities for providing a first conductive type with the second insulating layer 136 used as a dielectric layer. The semiconductor layer 160b which serves as the other electrode of the first capacitor element 166a is a region extending from the semiconductor layer 160a which forms a channel of the transistor 158. A second capacitor element 166b is formed from a second capacitor electrode 168b arranged in an upper surface of the fourth insulating layer 140, fifth insulating layer 170 arranged in an upper layer of the second capacitor electrode 168b, and the pixel electrode 174 in which at least a part overlaps with the second capacitor electrode 168b. Furthermore, the second capacitor electrode 168b is formed from a metal film such as aluminum, titanium, molybdenum or tungsten and the like.

When a pixel 106 having the structure shown in FIG. 12 is compared with the first terminal electrode 114a shown in FIG. 5A and a structure of a layer below, the first underlying structure layer 132a is a semiconductor layer which is formed in the same layer as the semiconductor layer 160a of the transistor 158. In addition, the second underlying structure layer 132b shown in FIG. 5B is a metal layer formed in the same layer as the gate electrode 162. Furthermore, the first underlying structure layer 132a shown in FIG. 12 is a semiconductor layer which is formed in the same layer as the semiconductor layer 160a of the transistor 158, and the second underlying structure layer 132b is a metal layer formed in the same layer as the gate electrode 162. A planar aspect of the underlying structure layer 132 arranged in the same layer as a layer which forms a pixel 106 can be formed into each shape shown in FIG. 4, FIG. 7, FIG. 8 and FIG. 9 so that a convex-concave shape (in other words, a surface formed with a plurality of inclined surfaces and flat surfaces) is included in the upper surface of a terminal electrode 114.

In this way, according to the present embodiment, it is possible to arrange an underlying structure layer for providing a convex-concave shape to the surface of the first terminal electrode 114a using a layer (semiconductor layer, wiring layer) which forms a pixel. In this way, it is possible to simplify the manufacturing process without the need to arrange new layers for an underlying structure layer. For example, since the semiconductor layer 160a is patterned in alignment with the transistor 158, it is possible to form a step pattern of the first underlying structure layer 132a in the same process. This is the same for the second underlying structure layer 132b corresponding to the gate electrode 162.

Furthermore, the first conducting layer 128 of the first terminal electrode 114a is formed in the same conducting layer as the source/drain wiring 164. In addition, the first insulating layer 134, second insulating layer 136, third insulating layer 138 and fourth insulating layer 140 in FIG. 5A are insulating layers corresponding to each insulating layer explained in FIG. 12, and extend from the pixel part 104 to the terminal part 112. That is, since the fourth insulating layer 140 which covers an end part of the first conducting film 128 is formed from an organic insulation material and is used as a planarization film, an upper surface of an end part of the first conducting film 128 is also planarized in the terminal part 112. Peeling of the first conducting film 128 is prevented by the fourth insulating layer 140, and a good electrical connection is formed between the first terminal electrode 114a and FPC substrate 116.

As explained above, according to one embodiment of the present invention, it is possible to arrange a convex-concave shape in a surface of an electrode of a terminal part (terminal electrode), increase contact area with an ACF resin layer, and improve adhesive strength. In this way, it is possible to prevent peeling after a FPC substrate or driver IC is mounted with a terminal part. In addition, since it is possible to improve adhesion between a terminal part and FPC substrate or driver IC regardless of the type of resin layer used in an ACF, it is possible to widen the range of selection of an ACF material and increase versatility.

The structure of a display device related to one embodiment of the present invention can be applied to a display device arranged with a light emitting element which uses an electroluminescence material in each pixel, or a display device which displays video using the electro-optical effects of a liquid crystal. In addition, the structure of a terminal part in a display device related to one embodiment of the present invention can be applied to other semiconductor devices (integrated circuits and the like) which include terminals connected via an ACF.

What is claimed is:

1. A display device comprising:
a substrate;
a pixel part including a circuit element over the substrate; and
a terminal part including a terminal electrode and located over the substrate, the terminal electrode electrically connected with the circuit element;
wherein the terminal electrode is located over an underlying structure layer having a surface formed from at least one inclined surface, the underlying structure layer arranged between the terminal electrode and the substrate and a flat surface,
the terminal electrode including a stepped surface along a surface formed from the inclined surface and the flat surface of the underlying structure layer in a surface of the terminal electrode, and
the underlying structure layer comprising a first underlying structural layer, a first insulating layer covering a side surface and an upper surface of the first underlying structural layer and extending to an outside of the terminal electrode, and a second underlying structural layer on top of the first underlying structural layer and the first insulating layer, and a second insulating layer covering a side surface and an upper surface of the second underlying structural layer and extending to the outside of the terminal electrode, the first underlying structural layer, the first insulating layer, the second underlying structural layer, and the second insulating layer forming the inclined surface and flat surface of the underlying structure layer.

2. The display device according to claim 1, wherein the underlying structure layer includes a lattice pattern or a stripe pattern, and a side end of the lattice pattern or stripe pattern corresponds to a surface formed from the inclined surface and flat surface.

3. The display device according to claim 1, wherein the underlying structure layer includes a through hole, and an aperture end of the through hole corresponds to a surface formed from the inclined surface and flat surface.

4. The display device according to claim 1, wherein the underlying structure layer includes an island shaped pattern, and an end part of the island shaped pattern corresponds to a surface formed from the inclined surface and flat surface.

5. The display device according to claim 1, wherein the underlying structure layer includes a surface formed from a plurality of inclined surfaces and flat surfaces.

6. The display device according to claim 1, wherein the underlying structure layer includes a semiconductor layer and the second underlying layer includes a metal layer.

7. The display device according to claim 1, wherein the terminal electrode contacts an anisotropic conductive film.

8. A display device comprising:
a substrate;
a pixel part including a pixel electrode and a transistor electrically connected with the pixel electrode; and
a terminal part including a terminal electrode and located over the substrate, the terminal electrode electrically connected with the transistor above a substrate;
wherein the transistor has a first semiconductor layer, gate insulating layer and gate electrode, the terminal electrode is located over an underlying structure layer having a surface formed from at least one inclined surface, the underlying structure layer arranged between the terminal electrode and the substrate and a flat surface, the terminal electrode includes a stepped surface along a surface formed from the inclined surface and the flat surface of the underlying structure layer in a surface of the terminal electrode, and the underlying structure layer comprising a first underlying structural layer, a first insulating layer covering a side surface and an upper surface of the first underlying structural layer and extending to an outside of the terminal electrode, and a second underlying structural layer on top of the first underlying structural layer and the first insulating layer, and a second insulating layer covering a side surface and an upper surface of the second underlying structural layer and extending to the outside of the terminal electrode, the first underlying structural layer, the first insulating layer, the second underlying structural layer, and the second insulating layer forming the inclined surface and flat surface of the underlying structure layer.

9. The display device according to claim 8, wherein the first underlying structural layer includes a second semiconductor layer arranged in a same layer as the first semiconductor layer in a cross-sectional view and arranged at a position different from the first semiconductor layer in plan view, and the second underlying structural layer includes a metal layer arranged in a same layer as the gate electrode in a cross-sectional view and arranged at a position different from the gate electrode in plan view.

10. The display device according to claim 9, wherein the first insulating layer includes a same material as the gate insulating layer, the first insulating layer is arranged in a same layer as the gate insulating layer in a cross-sectional view.

11. The display device according to claim 8, wherein the underlying structure layer includes a lattice pattern or a stripe pattern, and a side end of the lattice pattern or stripe pattern corresponds to a surface formed from the inclined surface and flat surface.

12. The display device according to claim 8, wherein the underlying structure layer includes a through hole, and an aperture end of the through hole corresponds to a surface formed from the inclined surface and flat surface.

13. The display device according to claim 8, wherein the underlying structure layer includes an island shaped pattern, and an end part of the island shaped pattern corresponds to a surface formed from the inclined surface and flat surface.

14. The display device according to claim 8, wherein an interlayer insulation film is included between the pixel electrode and the transistor, and the second insulating layer includes a same material as the interlayer insulating film, and the first insulating layer is arranged in a same layer as the interlayer insulation film in a cross-sectional view.

15. The display device according to claim 8, wherein the underlying structure layer includes a surface formed from a plurality of inclined surfaces and flat surfaces.

16. The display device according to claim 8, wherein the terminal electrode contacts an anisotropic conductive film.

* * * * *